United States Patent
Prather et al.

(10) Patent No.: US 7,176,720 B1
(45) Date of Patent: Feb. 13, 2007

(54) LOW DUTY CYCLE DISTORTION DIFFERENTIAL TO CMOS TRANSLATOR

(75) Inventors: Stephen M. Prather, Austin, TX (US); Jeffrey F. Waldrip, Austin, TX (US); Matthew S. Berzins, Austin, TX (US); Charles A. Cornell, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/798,657

(22) Filed: Mar. 11, 2004

Related U.S. Application Data

(60) Provisional application No. 60/454,965, filed on Mar. 14, 2003.

(51) Int. Cl.
 *H03K 19/0175* (2006.01)
 *H03K 3/45* (2006.01)

(52) U.S. Cl. .................. 326/80; 326/81; 330/261
(58) Field of Classification Search ........... 326/32, 326/21, 33, 34, 63–66, 81, 112, 119, 121, 326/122, 115, 117, 127, 129
See application file for complete search history.

(56) References Cited

U.S. PATENT DOCUMENTS

| | | | | |
|---|---|---|---|---|
| 4,622,480 A | * | 11/1986 | Uchimura et al. | 327/337 |
| 4,893,092 A | * | 1/1990 | Okamoto | 330/253 |
| 4,906,871 A | * | 3/1990 | Iida | 326/66 |
| 5,677,643 A | * | 10/1997 | Tomita | 327/78 |
| 5,684,429 A | * | 11/1997 | Sanwo et al. | 327/563 |
| 6,518,789 B2 | * | 2/2003 | Gossmann | 326/64 |

* cited by examiner

*Primary Examiner*—Vibol Tan
(74) *Attorney, Agent, or Firm*—Kevin L. Daffer; Daffer McDaniel, LLP

(57) ABSTRACT

Disclosed is a circuit comprising a differential input amplifier stage, a capacitor stage, an inverter chain stage, and a biasing circuit. The inverter chain stage may be formed with or without feedback depending on whether a clock signal or data signal is to be translated using the disclosed circuit. The biasing circuit can be formed using either inverters or transmission gates. Moreover, the biasing circuit, the inverter chain stage, and the amplifier stage can be connected to a power down circuit which, when the translator is not being used, will ensure various circuitry of the translator will not consume extensive power. The inverter chain stage, biasing circuit, and capacitor stage are formed on both an upper and lower section to produce true and complementary outputs that have a consistent and equal delay from the transitions of the incoming differential input signal so as to minimize jitter and associated duty cycle of the translated output.

17 Claims, 6 Drawing Sheets

LOW DUTY CYCLE DISTORTION DIFFERENTIAL TO CMOS TRANSLATOR

PRIORITY APPLICATION

This application claims priority to provisional application No. 60/454,965 entitled "Low Duty Cycle Distortion Differential to CMOS Transistor," filed Mar. 14, 2003.

BACKGROUND OF THE INVENTION

1. Field of the Invention

This invention relates generally to electronic circuitry and, more particularly, to translation of electronic signaling levels in integrated circuits.

2. Description of the Related Art

The following descriptions and examples are given as background information only.

The transmission of data involves sending and receiving data over a transmission path, or transmission medium. The transmission medium is generally coupled between a pair of transceivers, each of which preferably has a receiver and a transmitter. The receiver receives data from the transmission medium, and the transmitter drives data onto the transmission medium.

Numerous transmission protocols have been established for sending and receiving data across a transmission medium. For example, IEEE Std. 1596 specifies a protocol for sending differential signals across a transmission path to achieve a relatively high transfer rate, yet maintaining the benefits of common-mode rejection. The universal serial bus, or USB, is specified by the USB Revision 2.0 Specification available from, for example, "www.usb.org/developers/docs." Both of these standards utilize differential signals, alternatively known as low voltage differential signals (LVDS). In many instances, LVDS signals have voltage swings that are as low as 100 mV.

Although LVDS transmission can utilize small voltage swings and good noise cancellation characteristics useable for applications over long transmission media, the differential signals must be translated at the receiver so that the voltage levels are recognizable to the logic circuitry at the target location. In many instances, the target circuitry operates at MOS, BiCMOS, and Bipolar voltage levels, all of which are at a much higher voltage level than the differential signal voltage swing. The LVDS must, therefore, be converted or "translated" to the higher voltage swings of the core circuitry in order for the destination device to operate on the incoming data. While bipolar and BiCMOS technologies are often used, CMOS active devices in the destination core can save considerable power over other technologies.

It would be desirable to translate the differential signals to CMOS levels at the receiver, but would be even more desirable to perform the translation without significant jitter at the transitional edges of the incoming data stream. As used herein, jitter is generally referred to as an inconsistent, temporarily displaced transitional edge of a signal. For example, if a translator imparts greater delay when converting a rising edge of a differential signal to a rising edge of a CMOS signal than to a falling edge, the translator output will experience jitter. Essentially, jitter appears whenever the delay between rising and falling edges of a translated signal is inconsistent, or momentarily fluctuates over time. Descriptions of the effects of jitter on the duty cycle of a CMOS-translated signal is best illustrated in the examples of FIGS. 1 and 2.

FIG. 1 illustrates a receiver 10 coupled to receive differential signals sent over a transmission media 12. The differential signals can be fed into a termination resistor 14, for example. Termination resistor 14 produces the appropriate voltage differential at, for example, the output of amplifier 16. Amplifier 16 can therefore produce the appropriate output voltage levels into core logic 18. As data is being received by core logic 18, the data may have certain transitional edges from which a clock can be recovered by clock recovery circuitry 20. In order to accurately recover the data and clock transitions, it is imperative that the translation functions within receiver 10 be consistent for all transitions illustrated in FIG. 2.

FIG. 2 illustrates the incoming differential signal 20 and the translated signal 22. The LVDS can be amplified to a much higher voltage swing, as shown. In the case where the differential signals follow the USB specification, the time lapse between transitions ($t_1$) can be as low as 1.2 ns. In order for the translated signal 22 to avoid jitter and duty cycle distortion, the time lapse ($t_2$) between transitions of signal 22 must consistently match $t_1$ for all transferred data. Conventional translator circuitry introduce inconsistent time delay at $t_{d1}$ across differing transitional edges of signal 22. The inconsistency is due, in part to changes in temperature and voltage at which the translator operates. Inconsistency can also be caused by changes in processing, i.e., fabrication of one translator from that of another—each made from differing wafers processed slightly different from one another.

Recognizing that the translator will impart delay between a transition of the incoming differential signal to the amplified output signal, to avoid jitter and ensuing duty cycle distortion, the amount of delay on both the rising and falling edges must be consistent and equal. In other words, $t_{d1}$ must equal $t_{d2}$ for each transition.

An unfortunate aspect of conventional differential-to-full rail translators is that jitter and duty cycle distortion occurs during translation. A common method of implementing differential-to-full rail translation involves a standard single-ended output operational amplifier differential pair. The operational amplifier typically uses positive feedback to maximize gain, followed by an optional level shifting stage. The level shifter stage will then feed the level shifted voltage into an inverter to "square-off" the incoming signal. Unfortunately, however, the translating inverter, or the square-off inverter, has a trip point that is a strong function of process, voltage and temperature. Thus, a conventional translator will then introduce jitter at $t_{d1}$ and $t_{d2}$, causing duty cycle distortion when tested across process, voltage, and temperature variances.

When describing duty cycle distortion, it is often helpful to think of distortion as the outcome of jitter at four different points in time. First, jitter can occur between the positive edge of the differential signal to the positive edge of the translated true signal. Second, jitter can occur from the positive edge of the differential signal to the negative edge of the translated complementary signal. Third, jitter can occur from the negative edge of the differential signal to the negative edge of the translated true signal. Fourth, jitter can occur from the negative edge of the differential signal to a positive edge of the translated complementary signal. As the delay varies during data transfer in either of these four instances, jitter will occur and be recognized as a duty cycle distortion on the output signal.

A more idealized translator is needed that can achieve differential-to-full rail translation without duty cycle distortion. Moreover, it would be desirable to implement a translator that can achieve full rail output recognizable to CMOS core logic. A distortion-less duty cycle that is desirable is therefore one which can have the same delay over all four instances, consistent across all types of data and clock signals being transferred. Moreover, the distortion-less duty cycle that is desired must also be one that can be reliably achieved even though manufacturing process change, or operating temperature and voltage change over time.

SUMMARY OF THE INVENTION

The problems outlined above are in large part solved by an improved translator that has low duty cycle distortion when performing differential-to-full rail translation. The improved translator preferably performs translation to CMOS voltage levels with the same delays over all four instances described above. Thus, the improved translator can perform translation from LVDS levels to CMOS levels with the same delays consistently applied for each rising and falling edge of the LVDS to CMOS transitions at the worst-case process, voltage, and temperature corners. Thus, even if the process used in manufacturing an integrated circuit varies dramatically, the four delays will be the same and consistent. Moreover, even if temperatures or voltages skew during operation, the delays will still remain consistent.

According to one embodiment, the translator includes an amplifier, an alternating current (AC) coupling circuit, at least one inverter, and a biasing circuit. The amplifier might be a differential amplifier and the AC coupling circuit might be a capacitor. The differential amplifier can be used to receive the differential signal. The capacitor can be coupled to the output of the differential amplifier to couple transitions of the differential signal to the inverter. The biasing circuit can be coupled to both the capacitor and the inverter to essentially bias the input of the inverter to its trip point.

As noted herein, the trip point is defined to be a voltage level in which the input of the inverter equals its output. Depending on the relative strengths of the p-channel versus the n-channel transistors of the inverter, the trip point is somewhere between the power supply voltage (e.g., $V_{DD}$) and the ground supply voltage (e.g., $V_{SS}$). For example, if the p-channel transistor is of the same strength as the n-channel transistor, then the trip point will be approximately $V_{DD}/2$. Biasing the input of the inverter to the trip point places the inverter in a high gain state so that the edges coupled to the input of the inverter by the capacitor will cause the output of the inverter to transition toward the power supply and ground levels, even though the incoming edges are at very small voltage differences.

The biasing circuit can be realized in several ways. For example, the biasing circuit can be an inverter whose output is connected back to its input. By connecting the output and input of a trip-point-matched inverter onto the input of the inverter placed in the high gain path of the translator, the biasing circuit will ensure the high gain inverter is biased to a high gain state—i.e., at its trip point. Specifically, both inverters are MOS inverters, and more specifically are CMOS inverters having the same size ratio for the P-channel and N-channel transistors, so that they have the same trip points. The concept of using a separate inverter whose output is connected to its input as the biasing circuit is replicated on both the true and complementary outputs of the translator.

Alternatively, instead of using an inverter, the biasing circuit can simply be a transmission gate that, when enabled, resistively shorts the output of the inverter within the translator to its input. This will ensure the inverter used in the translator will have its input biased to its trip point. Use of a transmission gate is probably preferred due to its more simplistic implementation and less reliance on transistor matching.

According to yet another embodiment, the biasing circuit as well as the high-gain translating inverter can be placed in a low-power state during times when the translator is not being used. Moreover, the logic level output from the translator can be latched either at the output or internal to the translator during times when transitions of the incoming differential signal are absent. Thus, the translator can be used not only to translate regularly occurring transitions as in clock signal translation, but also to translate bursts of data transitions interspersed with no data transitions whatsoever. All such embodiments are contemplated herein.

BRIEF DESCRIPTION OF THE DRAWINGS

Other objects and advantages of the invention will become apparent upon reading the following detailed description and upon reference to the accompanying drawings in which.

Figure 1:
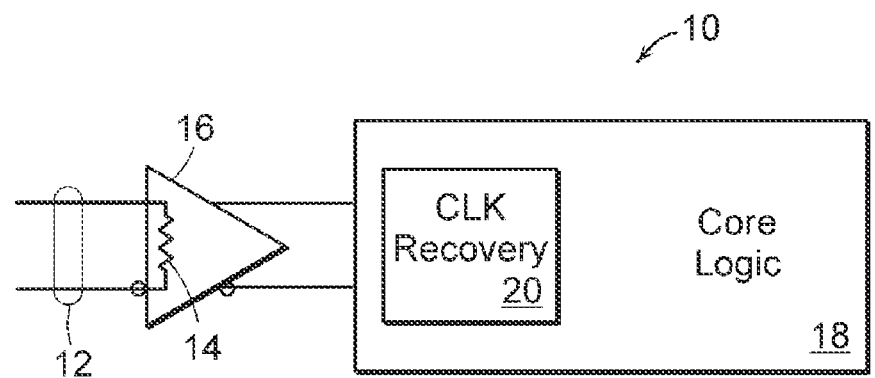
FIG. 1 is a block diagram of a receiver portion of a transceiver for receiving differential signals and producing a clock signal and data from the differential signals.
Figure 2:
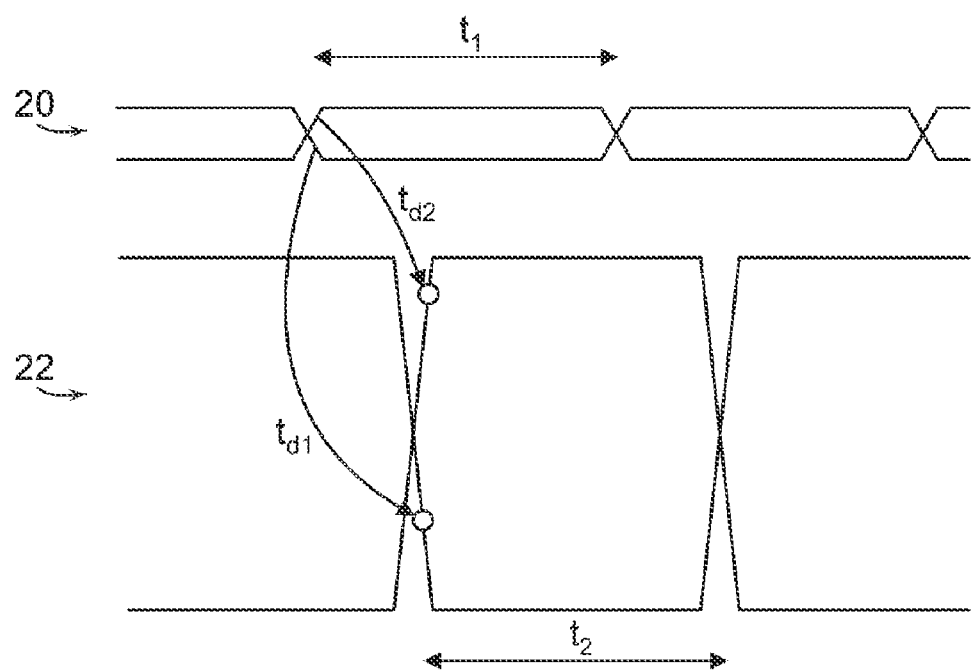
FIG. 2 is a timing diagram of differential input signals being amplified by a translator and the associated jitter and duty cycle distortion that can arise.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

The importance of maintaining low amounts of duty cycle distortion within a translated differential signal is significant if that translated signal is used, for example, to accurately recover clock and data or translate a clock. Both the rising and falling edges of the incoming differential data stream is translated so that both edges have the same delay within the translator. By making the delay constant for the rising and falling edges on both the true and complementary translator outputs for all edges of the incoming differential signal, little if any jitter will occur and duty cycle distortion will be significantly low and, basically, nonexistent. Those jitter-free edges can then be used in latches of, for example, a digital phase-locked loop (PLL) to sample centers of the incoming signal.

The PLL can then be used, depending on which edge has arrived upon the latch, to pick a corresponding phase from, for example, a voltage-controlled oscillator (VCO). The digital PLL will consume significantly low current and, thus, power if the PLL and associated latches therein are CMOS. By forming a translator within a receiver that translates from differential voltage levels to CMOS voltage levels that are thereafter used by the digital PLL, clock recovery can essentially occur using low-power consumptive CMOS technology within the receiver integrated circuit.

As known, a CMOS current path typically involves both a p-channel transistor and n-channel transistor. While the n-channel transistor is on (i.e., in saturation state), the p-channel transistor is typically off. Thus, no current path exists directly between the power supply and ground during most times in which the CMOS device is in operation. In some instances, however, both the p-channel transistor and n-channel transistor are on. This usually occurs when the incoming voltage level swings from one rail to the other. However, the incoming voltage usually is at steady state near the power supply or ground voltages except, as will be described below, in instances where the incoming voltage value is biased at its trip point. Biasing the incoming voltage occurs, however, only in one select inverter of the translator, not in the overall CMOS core logic, clock recovery, and PLL structures used to recover clock information and data edges. Confining power consumption to only one portion of the CMOS translator will, however, achieve benefits in lowering power consumption elsewhere.

Figure 3:
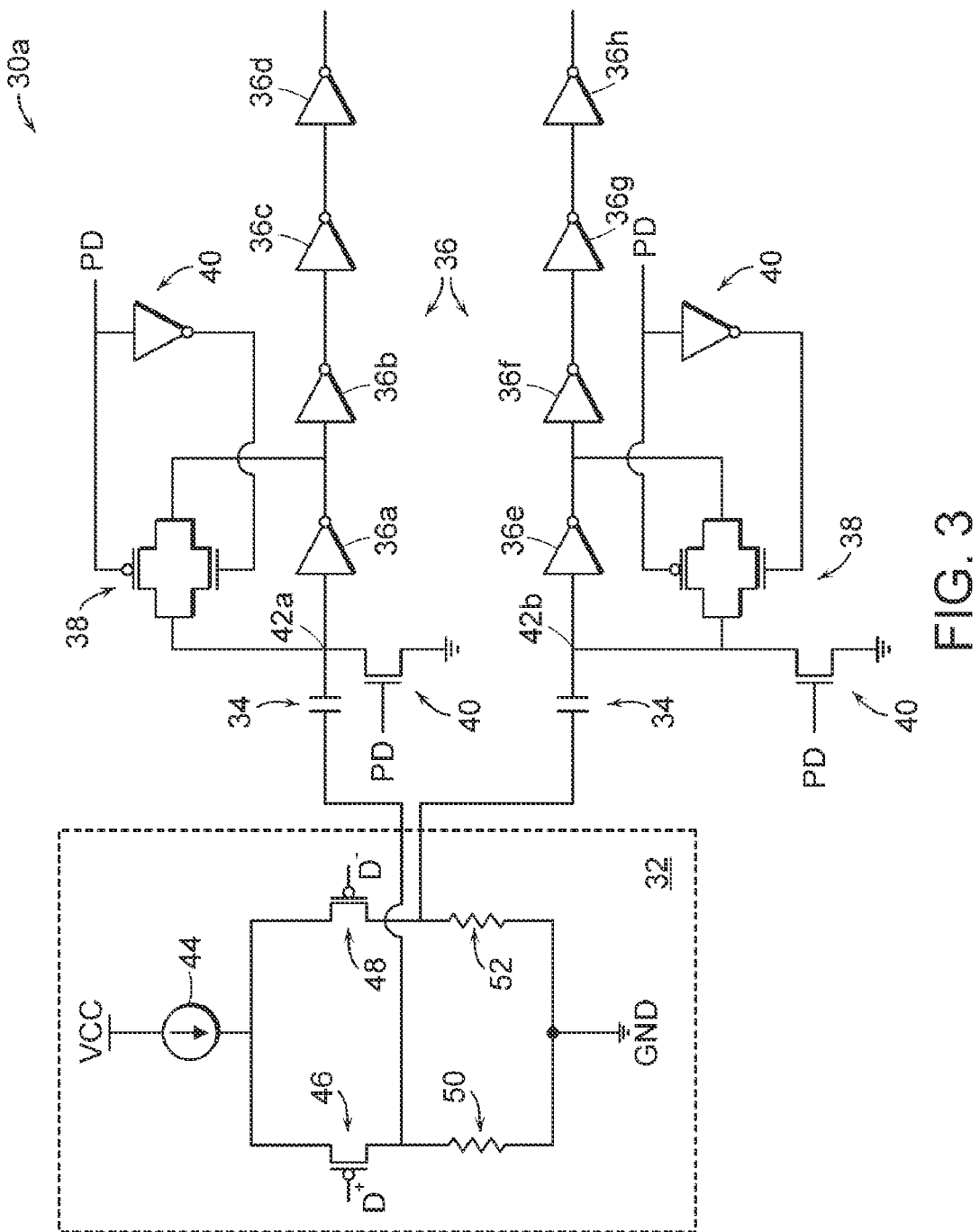
FIG. 3 is a circuit schematic of a translator according to one embodiment, wherein the translator is illustrated with power down circuitry.

Referring to FIG. 3, a translator 30a is shown according to one embodiment. Translator 30a includes a differential input stage 32, a capacitor stage 34, and an inverter chain stage 36. Translator 30a is, therefore, a circuit that also includes a biasing circuit 38 and a power down circuit 40. The capacitor stage 34, inverter chain stage 36, biasing circuit 38, and power down circuit 40 are duplicated on the upper ("true" output) and the lower ("complementary" output) to form a double-ended translator.

Inverters 36a and 36b in the upper section of the inverter chain 36 (and the corresponding inverters 36e and 36f in the lower section) make the output of nodes 42a and 42b more square and act as a two-stage amplifier. The additional inverter stages 36c, 36d, 36g, and 36h provide an even more "squaring" effect of the translated output. The ratio of the n-channel and p-channel transistors on inverters 36a and 36b must match the ratio on inverters 36e and 36f. While inverters 36b and 36f can be much larger than respective inverters 36a and 36e, the ratios must nonetheless be substantially the same to ensure than there are no differences in delay for transmitting logic 1s and 0s, which would result in a delay skew.

Differential input amplifier stage 32 comprises a current source 44 and two input transistors 46 and 48 whose gates are coupled to two differential inputs $D^+$ and $D^-$. Amplifier 32 also contains two resistors 50 and 52 that receive current based on which transistor 46 or 48 is more on. Each of the input transistors 46 and 48 has a source coupled to the current source 44, and a drain coupled to one of the two resistors that is coupled to ground. The differential input amplifier 32 is used to amplify the input signal and to reject any common-mode noise accumulated during transmission across the transmission medium. The common-mode rejection ratio can be selected or "tuned" to a wide range of DC voltage commonly applied to the differential input signals. The differential input amplifier 32 is required to produce any undistorted output. Distortion or clipping can cause an egg-shaped output that will result in differing amounts of time above and below the average output voltage.

The differential input amplifier 32 operates in the following manner. The positive output is greater than its quiescent voltage if the voltage of input $D^+$ is greater than the voltage of input $D^-$. The output is negative if the voltage of input $D^+$ is less than the voltage of input $D^-$. If there is a voltage swing of approximately 400–500 mV at the $D^+$ and $D^-$ inputs and there is sufficient drive capability (i.e., low output resistance of the driving circuit), then the differential input circuit may be removed. Other implementations using a variety of voltage ranges may also be used and are encompassed within the scope of this disclosure.

The capacitor stage 34 comprises two capacitors, one each on the upper and lower sections. The inverter chain stage 36 with feedback comprises an upper section and a lower section: the upper section includes inverters 36a–d and lower section includes inverters 36e–h. Biasing circuit 38 comprises any circuit that sets the input nodes 42a and 42b to the trip point of inverters 36a and 36e, respectively. The trip point of an inverter is defined above to be the voltage at which the inverter's output is equal to the inverter's input. One mechanism in which to set the trip point can be by resistively connecting the inverter output to the inverter input.

As shown in the embodiment of FIG. 3, a transmission gate 38 that is biased to transfer a signal from one end of the gate to the other operates to resistively short the output of inverter 36a and 36e to their corresponding input. Shorting the output to the input occurs by placing a logic 0 on the gate of the p-channel transistor and a logic 1 voltage on the gate of the n-channel transistor that form the transmission gate. Thus, as shown, the power down (PD) voltage is at a logic 0 when operating the transmission gate. However, if the transition gate is to achieve "open" status, PD must be set at a logic 1 value, which will cause the p-channel transistor to turn off and, through inversion by inverter 40, the n-channel transistor of transmission gate 38 will also turn off. Likewise, during power down in which circuit 30a is rendered inoperable, the voltage at node 42a and 42b will be pulled to ground. This will cause the input to inverters 36a and 36e to activate corresponding p-channel transistors in those inverters, but not the n-channel transistors and, thus, inverters 36a and 36e (and downstream inverters) will not consume power during the power down state.

Biasing circuit 38 essentially sets the output of inverters 36a and 36e to be equal to the input on those inverters. Thus, the inputs are set to the high-gain trip point between the power supply voltage and ground, depending on the ratio of the p-channel transistors to the n-channel transistors within inverters 36a and 36e. Placing node 42 at the trip point will essentially cause inverters 36a and 36e to be high gain amplifiers. Any slight change in voltage at node 42a and 42b will drive the output of inverters 36a and 36e toward the CMOS rail.

Placing the input voltage at node 42*a* at the trip point essentially achieves ideal jitter performance. It is not sufficient, however, to only consistently place the rising edge of a signal in the time domain. Both the rising edge and falling edge of the input signal should be faithfully translated to the translated outputs, otherwise duty cycle distortion (jitter) is introduced and the data contents of the clock phases are corrupted.

The jitter performance is particularly important when translating a USB 2.0 high speed data stream. The rising and falling edges of LVDS data must be faithfully transferred to the CMOS levels. If not, data extraction becomes more difficult since the smallest bit width permitted by the USB specification will be reduced by exactly the amount that the data translation introduces jitter. The USB specification is described in the document "Universal Serial Bus Revision 2.0 Specification" available from www.usb.org/developers/docs.

Circuit 30*a* translates differential data edges to complementary CMOS edges as a pure delay element without distorting time coherency. Due to the varying trip points of the first inverter across process, voltage, and temperature (PVT), any design that does not center the swing around the PVT self-biased trip point will not perform as well as circuit 30*a* shown. By centering the swing at node 42 using a trip point bias circuit 38, any transient voltages coupled by capacitors 34 will cause the voltage node 42 to swing around the trip point, regardless of any skews in process, voltage, or temperature on inverters 36*a* and 36*e*, or any other active and passive element of circuit 30*a* for that matter.

The voltage at the drain of transistors 46 and 48 in the differential input amplifier stage 32 is coupled to a first side of capacitor 34 in the capacitor stage, and the second side of capacitor 34 is coupled to the upper or lower section of the inverter chain stage 36. This arrangement capacitively couples the output of the differential input amplifier stage 32 to a trip point biased first inverter 36*a* and 36*e* in the inverter chain stage 36. The use of AC coupling allows the differential amplifier to be powered by a higher power supply (VCC) voltage than the power supply used by inverters 36, transmission gate 38, or power down circuit 40, for example.

As long as the amplitude of the coupled signal is lower than the maximum allowed voltage across the lower voltage field effect transistors (FET), the circuit will operate reliably. Using a higher voltage domain for the differential input amplifier stage 32 makes it easier to produce an undistorted output with strong amplitude. Thus, even in instances where the common mode voltage of the differential signals can extend to a relatively large magnitude, the power supply on the amplifier stage 32 can be adjusted upward accordingly. Yet, however, since the DC values are not imputed through capacitors 34 to node 42, a voltage domain separation essentially exists between the input amplifier stage 32 and inverters 36. The coupling capacitor 34 can, therefore, be thought of as an open circuit for direct current (DC) that allows independent DC levels on each side of coupling capacitors 34.

The capacitive coupling and trip point biased inverters 36*a* and 36*e* allow the attenuated output of the differential amplifier 32 to swing exactly around the trip point of inverters 36*a* and 36*e*, regardless of the PVT corner. The attenuation is due to a resistor and capacitor (RC) filter created by the series capacitance on the coupling capacitor 34 and the gate and drain capacitive load of inverters 36*a* and 36*e*, as well as a parallel resistance to AC ground created by the biasing transmission gate 38 in series with the parallel combo of N-channel FET and P-channel FET of the inverter, and in series with the output resistance, R, of the differential gain stage.

Figure 4:
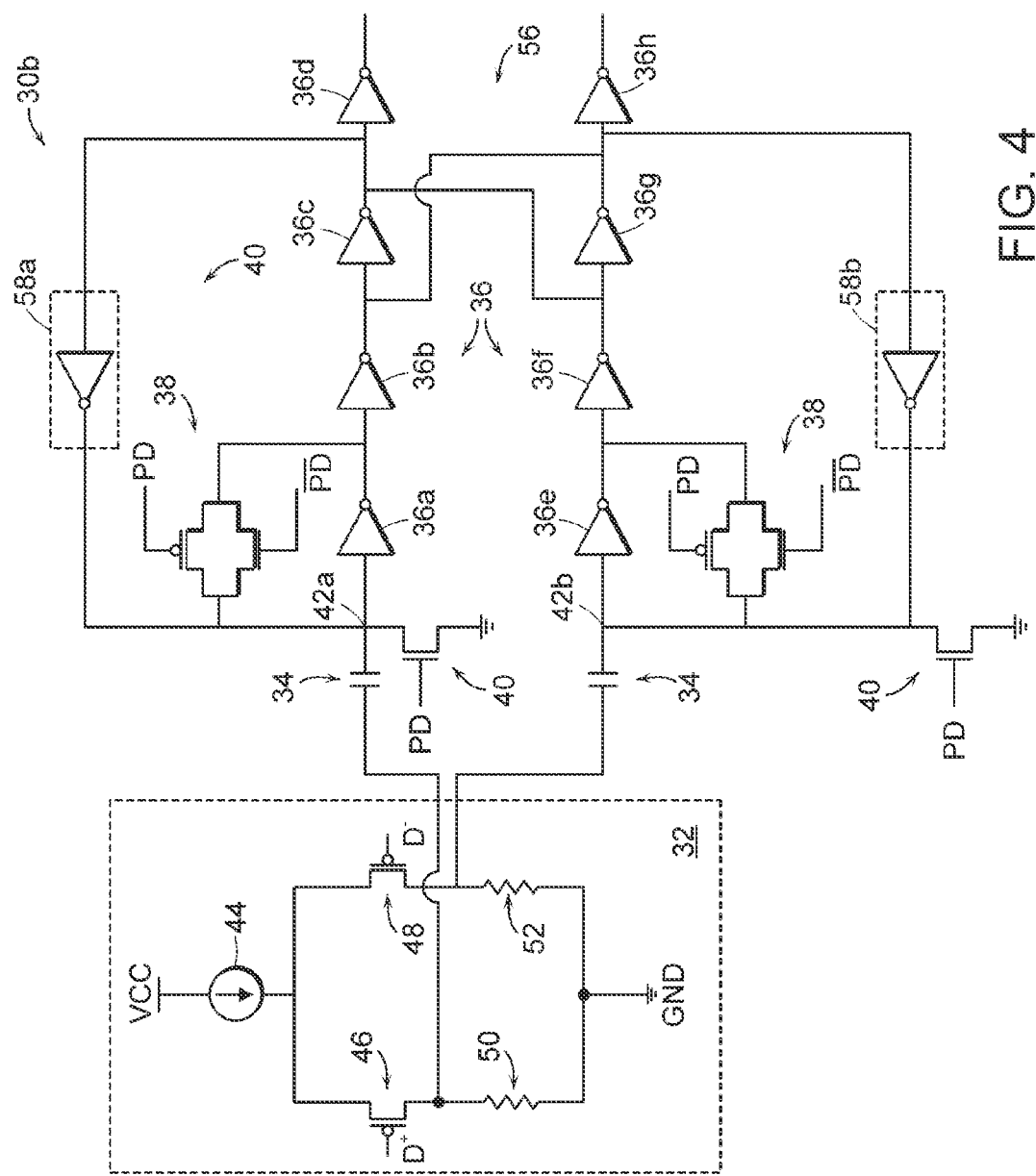
FIG. 4 is a circuit schematic of the translator of FIG. 3, wherein the translator is illustrated with an output latch and/or feedback inverter circuitry for logic state retention.

FIG. 4 illustrates an alternative translator circuit 30*b*. Circuit 30*b* of FIG. 4 has similar elements shown in FIG. 3 and are, therefore, provided with the same reference numerals. The only difference between the circuit of FIG. 4 and that of FIG. 3 is that the inverter within power down circuit 40 is eliminated for clarity of the drawing, and a cross-coupling 56 is shown, along with a feedback inverter 58. The circuit of FIG. 1 is suitable for translating clock-type signals since no output latching is required. For example, the differential signals can be simply clock signals that are regularly and consistently sent across the transmission medium. FIG. 3 is used to translate those differential clock signals into CMOS-level clock signals. However, there may be instances in which a translator is called upon to translate data signals.

In those instances in which data transitions are present and then is absent, a mechanism is needed for retaining the logic state on the output of the translator until such time as the new data stream arrives. One way of retaining the output logic state is to connect the output from inverter 36*c* to the output of inverter 36*f*, while also connecting the output from inverter 36*b* to the output of inverter 36*g*. Knowing the differential input signals will cause the true and complementary paths to produce opposite voltage values, the output from the second inverter in sequence (inverter 36*b*) will be at the same logic value as the output from the third inverter in sequence (inverter 36*g*). The same can be said of the relationship between inverters 36*c* and 36*f*. These connections will thereby form a weak latch that helps to ensure an even crossover of the true and complementary output from translator 30*b* of FIG. 4.

By latching the outputs of inverters 36*b*, 36*c*, 36*f*, and 36*g*, when circuit 30*b* is in a quiet state where there has been no differential input activity for some time, then depending of the last successful transition, the voltages at nodes 42*a* and 42*b* will be high or low since they have been latched in that state by the upstream inverters. The output of the weak latch 36*b* thereby has the same logical value as node 42*a*, and the output of weak latch 36*f* has the same logical value as node 42*b*. Circuit 30*b* is thereby constructed such that the output from 36*b* and 36*h* cross at almost the same time with no skew.

The swing at node 42*a* or 42*b* can be increased in four ways. First, by increasing the current source 44 in the differential amplifier stage 32 while decreasing the load resistors 50 and 52. Second, by increasing the size of coupling capacitor 34. Third, by minimizing the drive strength of inverters 36*a* and 36*e*. Fourth, by increasing the on-resistance of the biasing transmission gate 38. In the latter two instances, increasing the drive strength of inverters 36*a* and 36*e* will unduly "pin" the trip point at nodes 42*a* and 42*b* so that AC coupling will have a lessened effect on that node voltage. Reducing the drive strength of inverters 36*a* and 36*e* will reduce the pinning effect or, alternatively, increasing the on-resistance of transmission 38 will also reduce the pinning effect. A larger on-resistance will allow the voltage nodes 42*a* and 42*b* to fluctuate slightly from the output of inverters 36*a* and 36*e* so that AC coupling will have a magnified effect.

The drive strength of the feedback inverter 58*a* and 58*b* can also affect the DC biasing at nodes 42*a* and 42*b*. For example, if the drive strength of inverter 58*a* and 58*b* (or simply 58) is increased, node 42 will have a lessened propensity for AC coupling of transient from the differential amplifier 32. Therefore, inverter 58 is typically made as a weak inverter with lessened drive strength. Weak inverters 58 are designed to be strong enough to maintain a complement of the logic value from inverters 36c and 36g onto node 42, yet not too strong as to not allow AC coupling change at that node. The purpose of feedback inverter 58 is, therefore, to maintain a logic value of the previous differential input signal if the data stream should disappear, but not so strong as to prevent rapid changes of voltage at the sensing node 42 once the data reappears.

Figure 5:
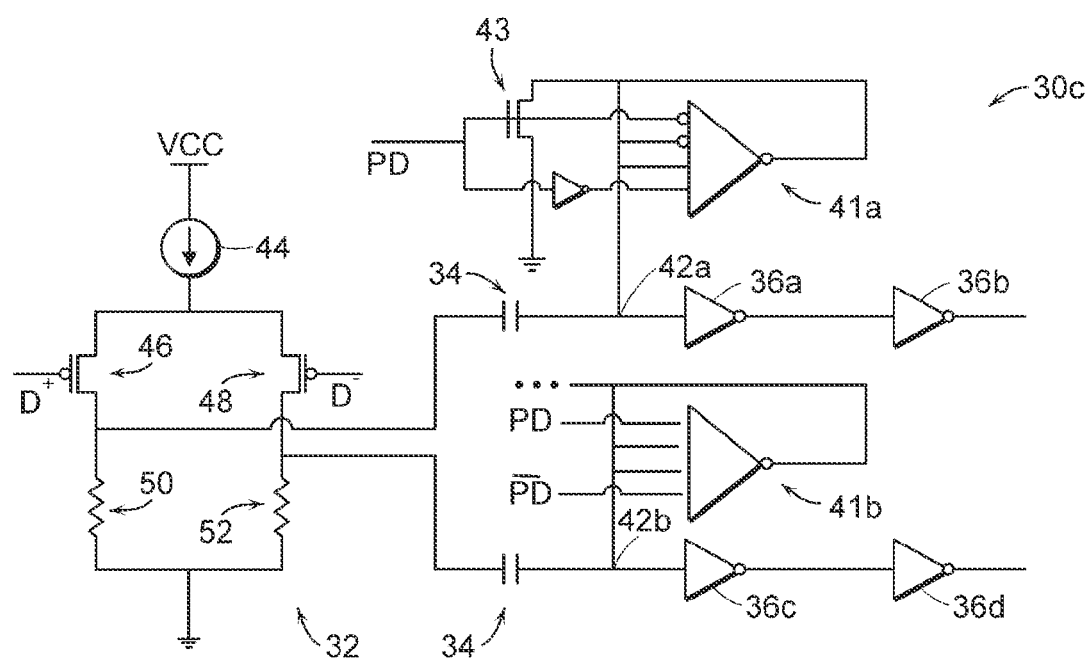
FIG. 5 is a circuit schematic of a translator according to another embodiment, wherein the translator is illustrated with power down circuitry.

FIG. 5 illustrates an additional alternative translator circuit 30c. Like the previous embodiments, circuit 30c comprises a differential input amplifier stage 32, capacitor stage 34, and an inverter chain 36. Unlike the inverter chain of FIG. 4, inverter chain 36 of FIG. 5 does not include a weak feedback inverter 58 or any latching 56 at select outputs of the inverter chain. Thus, circuit 30c is used to translate clocking signals and not necessarily data signals that might have momentary lapses in transitions.

Circuit 30c is different from the embodiments of FIGS. 3 and 4 primarily because of differences in the biasing circuit. The biasing circuit 41a and 41b (or 41) of FIG. 5 constitutes a four-input inverter. Two inputs to the biasing circuit inverter 41 are reserved for receiving a power down (PD) signal. If, for example, PD is at a logic low voltage value, then biasing circuit 41 is operable and the output from biasing circuit 41 is connected to its input. More specifically, the drive strength of the p-channel and n-channel transistors of biasing circuit 41 are by design made equal to the drive strengths of inverter 36a and 36c. Making the drive strengths equal is achieved by setting the p- to n-channel ratios in inverter 41 equal to inverters 36a and 36c. The relatively large gain of inverters 36a and 36c will emphasize the difference in trip points between the biasing inverter 41. Accordingly, it is important that the trip point of the two inverters 36a and 41 (and 36c and 41) are well matched.

During instances in which circuit 30c is disabled and rendered inoperable, possibly during a sleep or stand-by mode, PD will be driven to a logic high voltage value to basically prevent inverter 41 from consuming power. Also, by connecting node 42 to power through a pull-down transistor 43, a logic high voltage value at PD will cause inverters 36a and 36c to also not consume power during the stand-by or sleep mode. For sake of brevity in the drawing, pull-down transistor 43 is not shown for the lower path. However, it is recognized that the pull-down circuitry is mimicked from the upper path to the lower path. Also, FIG. 5 illustrates only two inverters in the chain rather than four as in FIGS. 3 and 4. The added inverters of FIGS. 3 and 4 are used for buffering and may be removed if desired.

Figure 6:
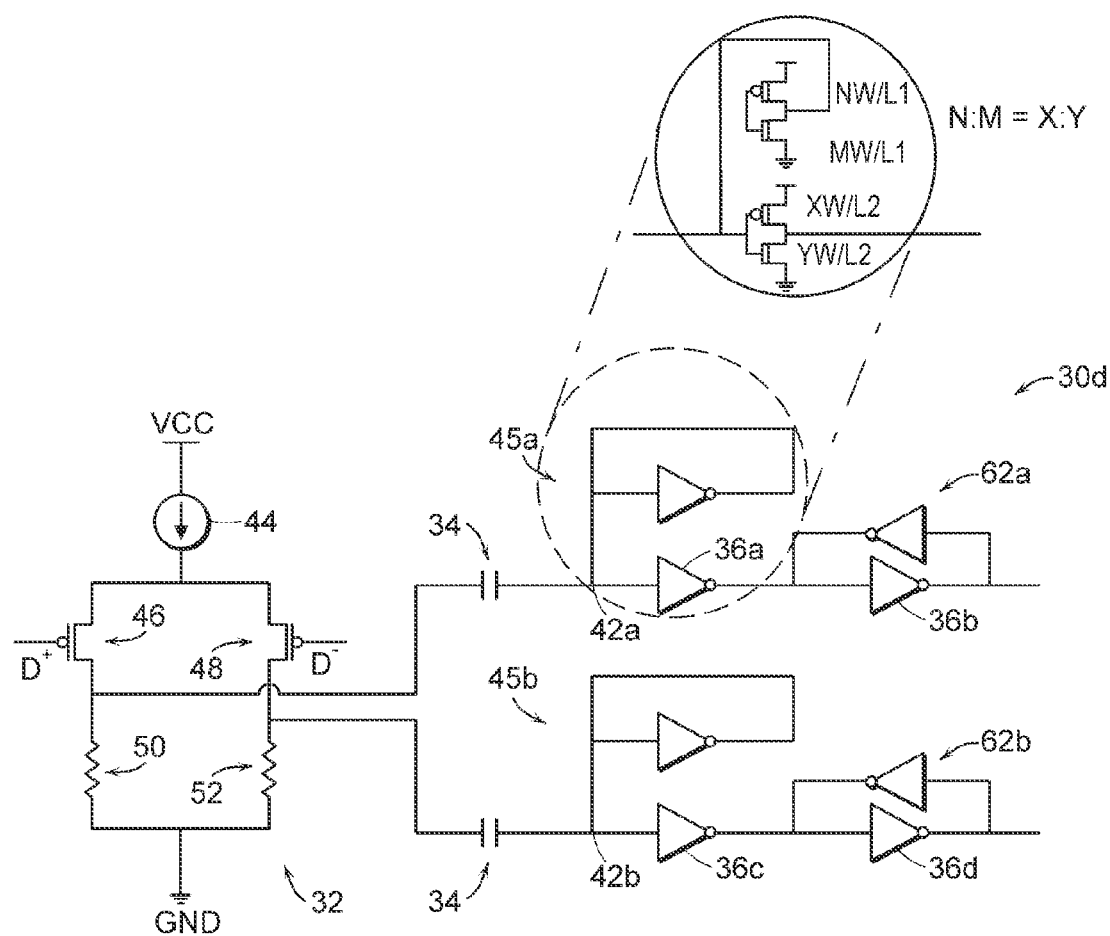
FIG. 6 is a circuit schematic of the translator of FIG. 5, wherein the translator is illustrated with a latch on its output for logic state retention.

FIG. 6 illustrates an additional alternative translator circuit 30d. If power down capability and low power consumption during stand-by or sleep mode is not needed, then the circuit of FIG. 6 can be used. Moreover, circuit 30d absent a power down circuit can include a feedback inverters 62a and 62b. The feedback inverters will latch the outputs from translator 30d during instances when the incoming differential signal is absent. Circuit 30d is, therefore, primarily used when translating data signals that might occur in bursts. Circuit 30d also includes two transistor inverters as the biasing circuit 45a and 45b (or 45) rather than a four transistor embodiment (FIG. 5). Similar to biasing circuit 41a and 41b (FIG. 5), biasing circuit 45 includes an inverter with the same p- to n-channel ratio as inverters 36a and 36c. By coupling the output of the biasing inverter to the input, nodes 42a and 42b are assured to be at the trip point of inverters 36a and 36c, respectively.

Figure 7:
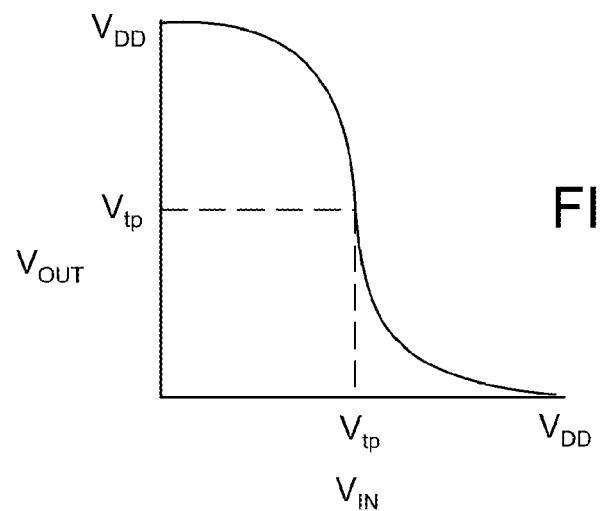
FIG. 7 is a graph of input voltage versus output voltage for an inverter, wherein a trip point voltage (Vtp) occurs where the input voltage equals the output voltage.

FIG. 7 illustrates input voltage versus output voltage for, e.g., CMOS inverter 36a and 36e (FIGS. 3 and 4) or CMOS inverter 36a and 36c (FIGS. 5 and 6). The trip point ($V_{tp}$) at the input of the inverter ($V_{IN}$) is shown to be at the same voltage value as the output ($V_{OUT}$).

Figure 8:
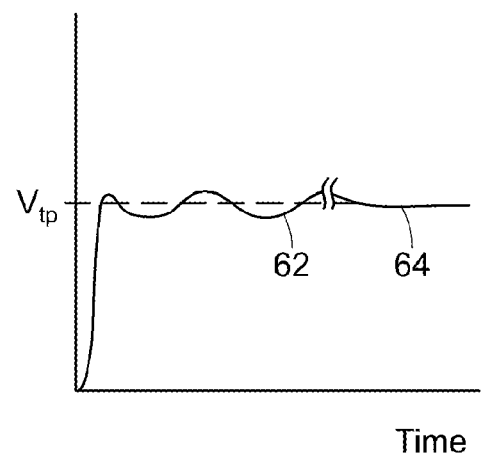
FIG. 8 is a timing diagram of the voltage at the input of a high-gain inverter amplifier.

Using the diagramed trip point, FIG. 8 illustrates the AC coupled output from the differential amplifier stage placed onto the trip point biased voltage at the input of the first inverter (i.e., at node 42a and 42b). See, FIGS. 3–6. If the differential input signal is terminated, FIG. 8 illustrates the biasing circuit will draw the voltage at node 42 toward the trip point, as shown by comparing the voltage value before and after the break in incoming differential signals. See and compare the line at reference numeral 62 with the line at reference numeral 64.

Figure 9:
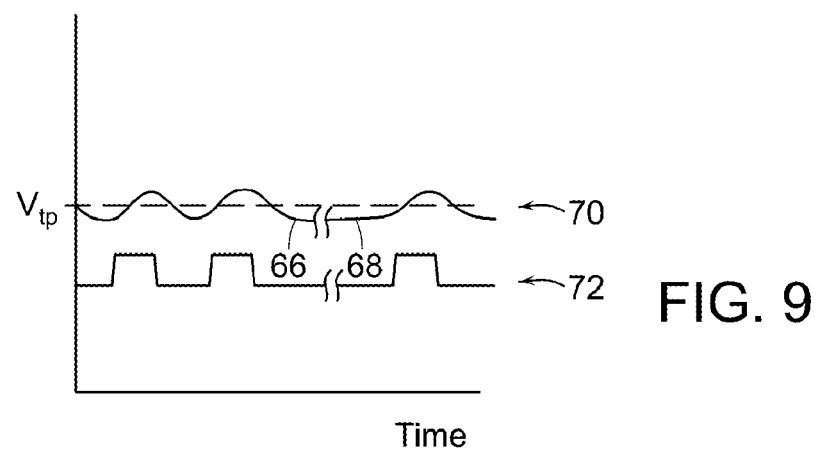
FIG. 9 is a timing diagram of the voltage output of a differential amplifier placed on an input of the trip point biased inverter, where the input retains the previous differential amplifier output even though transitional data is no longer placed on the input of the differential amplifier.

If, however, a keep mechanism, such as a latch on the output or a feedback inverter from the output to the input, is employed (FIGS. 4 and 6), the last switched value can be maintained even when the incoming data is removed. See and compare the differences between the voltage at line 66 and line 68 in FIG. 9. FIG. 9 illustrates the voltage swing around the trip point on node 42 as the line reference 70, compared against the incoming data stream as line reference 72.

It should be appreciated that referenced throughout this specification to various embodiments means that a particular feature, structure, or characteristic described in connection with the embodiment or embodiments, is included in at least one embodiment of the present invention. Therefore, it is emphasized and should be appreciated that two or more references to an embodiment, one embodiment, or an alternative in various portions of this specification are not necessarily all referring to the same embodiment. Furthermore, the particular features, structures, or characteristics may be combined as suitable in one or more embodiments of the invention.

It will be appreciated to those skilled in the art having the benefit of this disclosure the various embodiments herein are ones involving a communication system, a receiver, a translator or, specifically, a circuit which translates voltage levels. The voltage amount set forth above are merely examples and are not intended to limit the following claims which must be interpreted to embrace all such modifications and changes. Accordingly, the specification and drawings are to be regarded in an illustrative rather than a restrictive sense.

What is claimed is:

1. A circuit, comprising:
   a differential amplifier;
   a capacitor coupled to an output of the differential amplifier;
   an inverter coupled to the capacitor; and
   a biasing circuit comprising a transmission gate that includes a p-channel transistor coupled in parallel with a n-channel transistor between the capacitor and the inverter, wherein a gate terminal of the p-channel transistor is coupled to a power down voltage at a power supply voltage and a gate terminal of the n-channel transistor is coupled to a ground supply voltage during power down of the circuit.

2. The circuit as recited in claim 1, wherein the inverter comprises a p-channel transistor coupled in series with an n-channel transistor.

3. The circuit as recited in claim 1, wherein the capacitor comprises a pair of conductive terminals separated by a dielectric, and wherein a first terminal of the pair of terminals is coupled to the output of the differential amplifier and a second terminal of the pair of terminals is coupled to the inverter.

4. The circuit as recited in claim 1, wherein the inverter comprises a terminal coupled to the capacitor.

5. The circuit as recited in claim 1, wherein a gate terminal of the p-channel transistor is coupled to the power down voltage at a ground supply voltage and a gate terminal of the n-channel transistor is coupled to the power supply voltage during operation of the circuit.

6. The circuit as recited in claim 1, wherein the biasing circuit comprises a second inverter.

7. The circuit as recited in claim 6, wherein the second inverter comprises both an input and an output coupled to the capacitor.

8. The circuit as recited in claim 6, wherein the inverter comprises a first p-channel transistor and an first n-channel transistor having substantially the same gate length but having a first p-channel gate width at a first ratio relative to first n-channel gate width, and wherein the second inverter comprises second p-channel transistor and a second n-channel transistor having substantially the same gate length but having a second p-channel gate width at a second ratio relative to a second n-channel gate width, and wherein the first ratio is approximately equal to the second ratio.

9. A receiver, comprising:
a pair of inverters;
a biasing circuit coupled to an input of each of the pair of inverters to bias a voltage on the pair of inverters to a trip point of the inverters;
a differential amplifier adapted to receive a differential input signal forwarded to the receiver from a transmission medium; and
a pair of capacitors coupled between the pair of inverters and respective pair of outputs of the differential amplifier to place upon each of the pair of inverters changes in voltage centered around the trip point, wherein the changes in voltage correspond to changes in amplitude of the differential input signal.

10. The receiver as recited in claim 9, wherein each of the pair of inverters is a complementary metal oxide semiconductor (CMOS) inverter.

11. The receiver as recited in claim 9, wherein the biasing circuit comprises a transmission gate coupled between the input and output of each of the pair of inverters to maintain a direct current (DC) voltage bias on the input of each of the pair of inverters approximately at the trip point of the inverters.

12. The receiver as recited in claim 9, wherein the transmission gate comprises a p-channel transistor coupled in parallel with an n-channel transistor, wherein, during operation, a gate terminal of the p-channel transistor is coupled to a power down voltage at a ground supply voltage and a gate terminal of the n-channel is coupled to a power supply voltage, and wherein during non-operation, the gate terminal of the p-channel transistor is coupled to the power down voltage at a power supply voltage and a gate terminal of the n-channel is coupled to the ground supply voltage.

13. The receiver as recited in claim 9, wherein the biasing circuit comprises a second inverter having an input coupled to an output of the inverter and also having an output coupled to an input of the inverter.

14. The receiver as recited in claim 13, wherein the ratio of gate widths p-channel and n-channel transistors of the inverter and the second inverter are substantially equal.

15. The receiver as recited in claim 13, wherein the second inverter comprises a four-input inverter, with two inputs coupled to receive a power supply voltage and a ground supply voltage.

16. A method for translating voltages of a differential signal to complementary metal oxide semiconductor (CMOS) voltages, comprising:
biasing an input of a CMOS inverter to a trip point at which a voltage on the input of CMOS inverter substantially equals a voltage on the output of the CMOS inverter;
coupling onto the CMOS inverter an alternating current (AC) component of the differential signal absent a direct current (DC) component of the differential signal;
switching the inverter output to CMOS voltage levels whenever the AC component causes the voltage on the biased input of the CMOS inverter to exceed or become less than the trip point of the inverter; and
removing the biasing and driving the biasing to a ground supply voltage during times when the differential signal is absent.

17. The method as recited in claim 16, wherein the biasing comprises maintaining a previous AC component of the differential signal onto the biased input of the CMOS inverter during times when the differential signal is removed.

* * * * *